(12) United States Patent
Harbert et al.

(10) Patent No.: US 11,211,269 B2
(45) Date of Patent: Dec. 28, 2021

(54) MULTI-OBJECT CAPABLE LOADLOCK SYSTEM

(71) Applicant: Applied Materials, Inc., Santa Clara, CA (US)

(72) Inventors: Andrew Paul Harbert, Austin, TX (US); Michael C Kuchar, Georgetown, TX (US); Nicholas Michael Bergantz, Sunnyvale, CA (US); Leon Volfovski, Mountain View, CA (US); Sivakumar Ramalingam, Bangalore (IN); Karuppasamy Muthukamatchi, Madurai (IN); Douglas R McAllister, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/923,903

(22) Filed: Jul. 8, 2020

(65) Prior Publication Data

US 2021/0020476 A1    Jan. 21, 2021

(30) Foreign Application Priority Data

Jul. 19, 2019    (IN) .............................. 201941029137

(51) Int. Cl.
*H01L 21/67*     (2006.01)
*H01L 21/687*    (2006.01)
(Continued)

(52) U.S. Cl.
CPC .. *H01L 21/67201* (2013.01); *H01L 21/67376* (2013.01); *H01L 21/67379* (2013.01);
(Continued)

(58) Field of Classification Search
CPC ......... H01L 21/67201; H01L 21/67376; H01L 21/67379; H01L 21/67383;
(Continued)

(56) References Cited

U.S. PATENT DOCUMENTS

| 6,199,291 B1 | 3/2001 | Ozee |
| 6,676,759 B1 | 1/2004 | Takagi |

(Continued)

FOREIGN PATENT DOCUMENTS

| JP | 10165884 A | 6/1998 |
| JP | 2006273563 A | 10/2006 |

(Continued)

OTHER PUBLICATIONS

International Search Report and Written Opinion dated Nov. 5, 2020, on Application No. PCT/2020/042632.

(Continued)

*Primary Examiner* — Glenn F Myers
(74) *Attorney, Agent, or Firm* — Lowenstein Sandler LLP

(57) ABSTRACT

A method includes receiving, by a first loadlock chamber of the loadlock system, a first object from a factory interface via a first opening. The first object is transferred into the first loadlock chamber via a first robot arm. The factory interface is at a first state. The first loadlock chamber is configured to receive different types of objects. The method further includes sealing a first loadlock door against the first opening to create a first sealed environment at the first state in the first loadlock chamber and causing the first sealed environment of the first loadlock chamber to be changed to a second state. The method further includes actuating a second loadlock door to provide a second opening between the first loadlock chamber and a transfer chamber. The first object is to be transferred from the first loadlock chamber to the transfer chamber via a second robot arm.

20 Claims, 7 Drawing Sheets

(51) Int. Cl.
*H01L 21/677* (2006.01)
*H01L 21/673* (2006.01)

(52) U.S. Cl.
CPC .. *H01L 21/67383* (2013.01); *H01L 21/67393* (2013.01); *H01L 21/67772* (2013.01); *H01L 21/68707* (2013.01)

(58) Field of Classification Search
CPC ........ H01L 21/37393; H01L 21/67772; H01L 21/68707; H01L 21/67236; H01L 21/6875; H01L 21/68778; H01L 21/67155; H01L 21/67775; H01L 21/67778
See application file for complete search history.

(56) References Cited

U.S. PATENT DOCUMENTS

| | | | |
|---|---|---|---|
| 7,792,350 B2 | 9/2010 | Kiley et al. | |
| 8,384,033 B2 | 2/2013 | Kremerman | |
| 8,397,739 B2 | 3/2013 | Gregor et al. | |
| 8,784,033 B2 | 7/2014 | Kremerman et al. | |
| 9,457,464 B2 | 10/2016 | Kremerman et al. | |
| 9,579,788 B2 | 2/2017 | Rosenberg et al. | |
| 9,881,820 B2 | 1/2018 | Wong et al. | |
| 9,947,517 B1 | 4/2018 | Luere et al. | |
| 10,014,198 B2 | 7/2018 | Richardson | |
| 10,041,868 B2 | 8/2018 | Gottscho | |
| 10,062,589 B2 | 8/2018 | Wong et al. | |
| 10,062,590 B2 | 8/2018 | Wong et al. | |
| 10,062,599 B2 | 8/2018 | Genetti et al. | |
| 10,103,010 B2 | 10/2018 | Luere et al. | |
| 10,124,492 B2 | 11/2018 | Genetti et al. | |
| 10,566,205 B2 * | 2/2020 | Salinas | H01L 21/02063 |
| 10,964,584 B2 | 3/2021 | Volfovski et al. | |
| 2003/0164362 A1 | 9/2003 | Bagley et al. | |
| 2005/0137751 A1 | 6/2005 | Cox et al. | |
| 2007/0134904 A1 | 6/2007 | Wan et al. | |
| 2010/0054905 A1 | 3/2010 | Behdjat et al. | |
| 2010/0194015 A1 | 8/2010 | Vekstein et al. | |
| 2010/0226736 A1 * | 9/2010 | Borden | H01L 21/67201 414/217 |
| 2013/0337655 A1 | 12/2013 | Lee et al. | |
| 2016/0211165 A1 | 7/2016 | McChesney et al. | |
| 2016/0211166 A1 | 7/2016 | Yan et al. | |
| 2016/0216185 A1 | 7/2016 | Gottscho | |
| 2016/0314997 A1 | 10/2016 | Reuter et al. | |
| 2017/0053819 A1 | 2/2017 | Richardson | |
| 2017/0092511 A1 | 3/2017 | Basu et al. | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0119339 A1 | 5/2017 | Johnson et al. | |
| 2017/0133283 A1 | 5/2017 | Kenworthy | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0287682 A1 | 10/2017 | Musselman et al. | |
| 2017/0287753 A1 | 10/2017 | Musselman et al. | |
| 2017/0330786 A1 | 11/2017 | Genetti et al. | |
| 2017/0334074 A1 | 11/2017 | Genetti et al. | |
| 2018/0019107 A1 | 1/2018 | Ishizawa | |
| 2018/0019142 A1 | 1/2018 | Wong et al. | |
| 2018/0032062 A1 | 2/2018 | Trussell et al. | |
| 2018/0040492 A1 | 2/2018 | Wong et al. | |
| 2018/0068879 A1 | 3/2018 | Wong et al. | |
| 2018/0090354 A1 | 3/2018 | Sugita et al. | |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0315583 A1 | 11/2018 | Luere et al. | |
| 2018/0315640 A1 | 11/2018 | Ueda et al. | |
| 2019/0088531 A1 | 3/2019 | Barcode | |
| 2019/0393061 A1 * | 12/2019 | Amano | G01V 8/12 |
| 2020/0027742 A1 * | 1/2020 | Lee | H01L 21/02071 |
| 2020/0122320 A1 | 4/2020 | Yoshida | |

FOREIGN PATENT DOCUMENTS

| | | | |
|---|---|---|---|
| JP | 2009095783 A | | 5/2009 |
| JP | 4559317 B2 | | 10/2010 |
| KR | 101390900 B1 | | 4/2014 |
| KR | 20160016409 A | | 2/2016 |

OTHER PUBLICATIONS

International Search Report and Written Opinion dated Sep. 1, 2020, for application No. PCT/US2020/033774.
Entegris F300 AutoPds, Wafer Carrier Clean, Secure wafer transport and optimum automation intergartion, https://www.entergris.com.
Entegris Spectra Foup, Front opening unified pod platform with superior microenvironment control, https:/www.entegris.com/content/dam/shared-product-assets/wafer-processing/datasheet-spectra-foup-2413.pdf, Retrieved May 20, 2019.

* cited by examiner

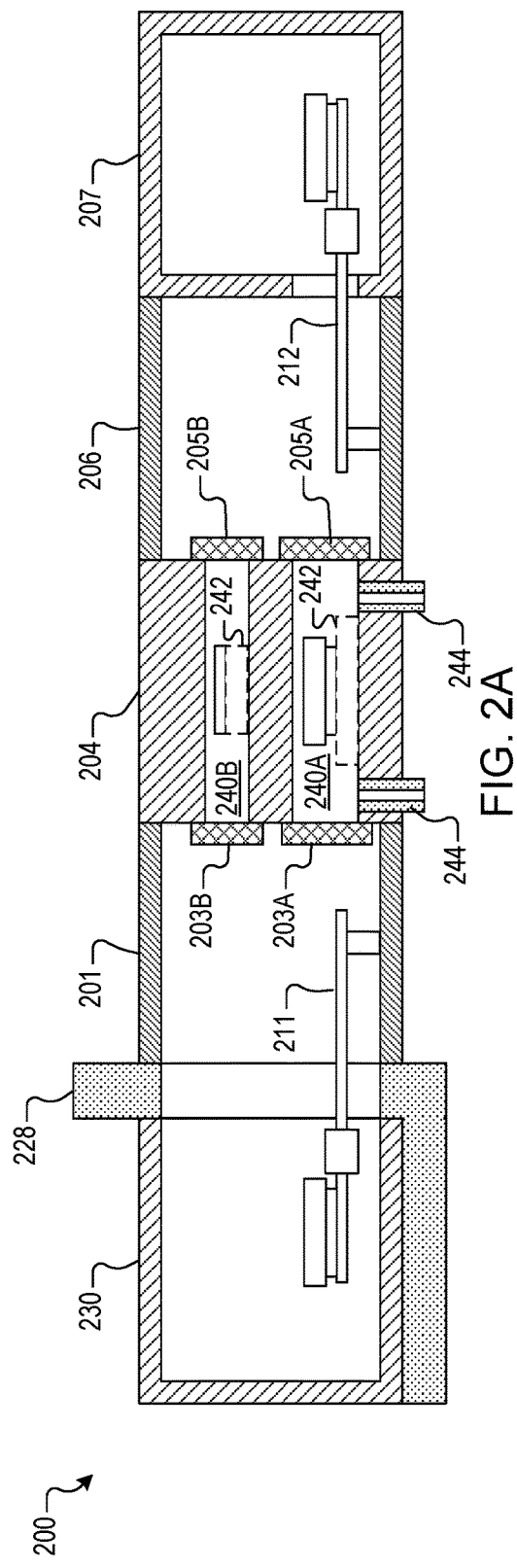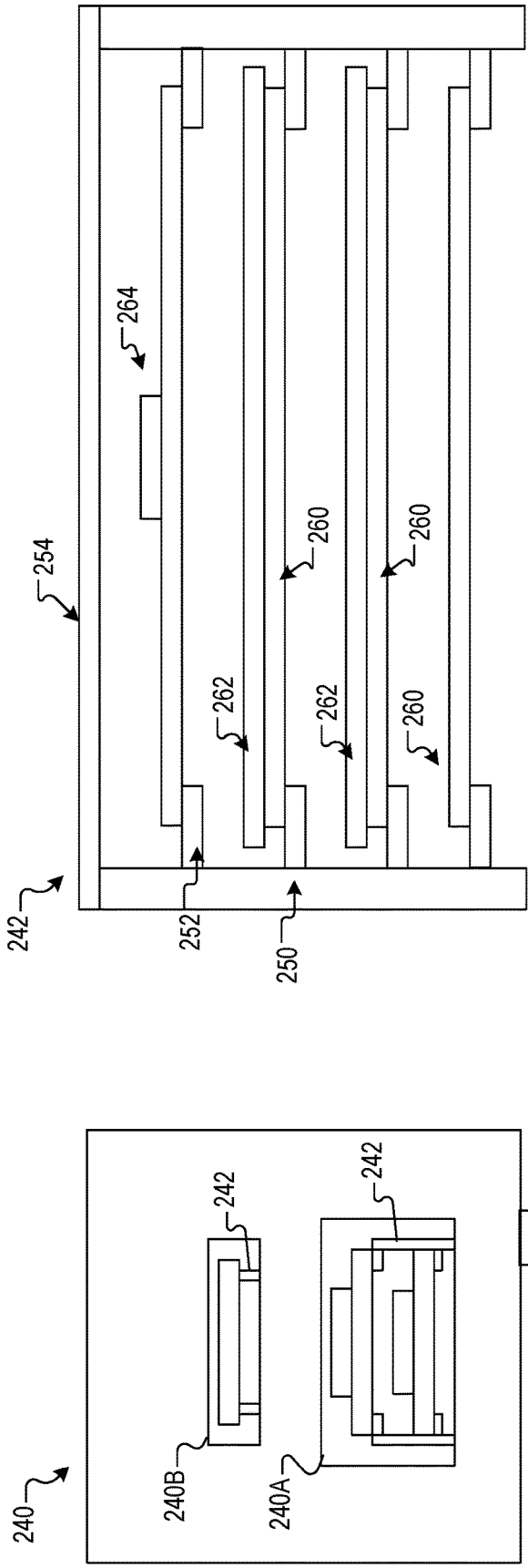

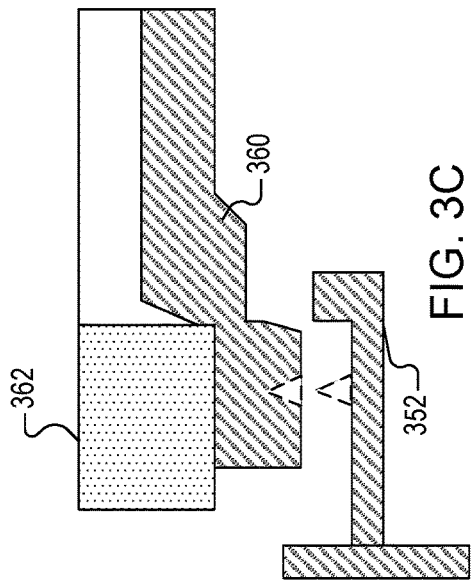
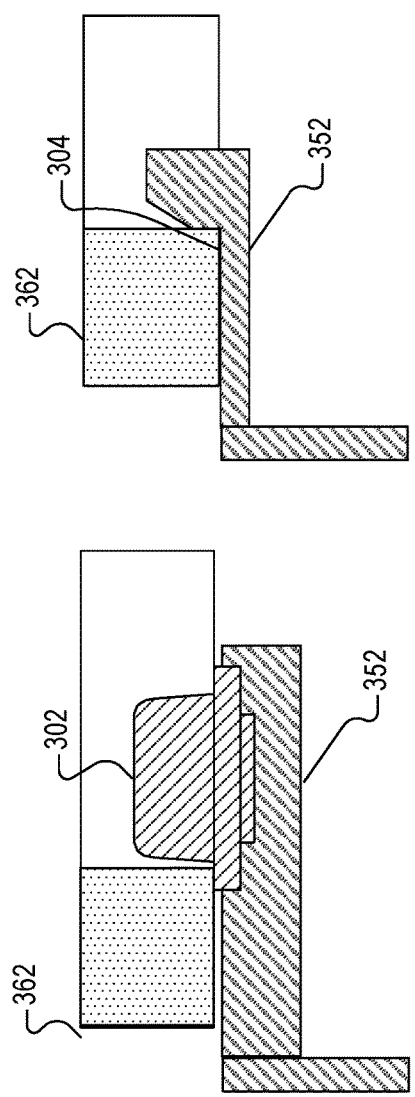
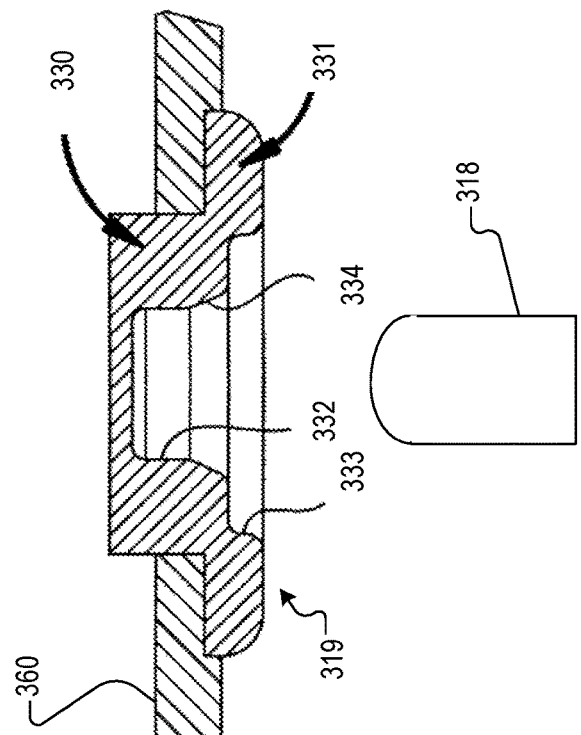
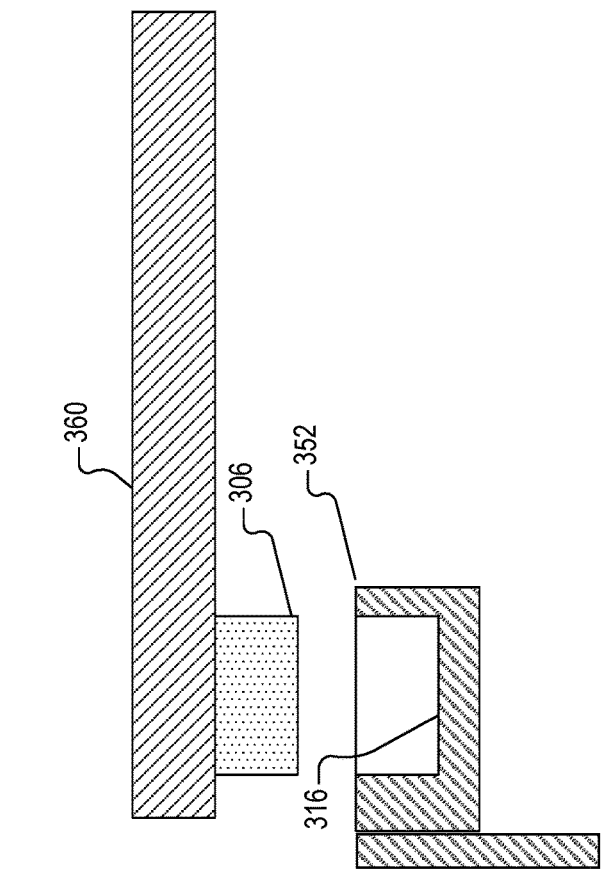
FIG. 3A  FIG. 3B  FIG. 3C  FIG. 3D  FIG. 3E

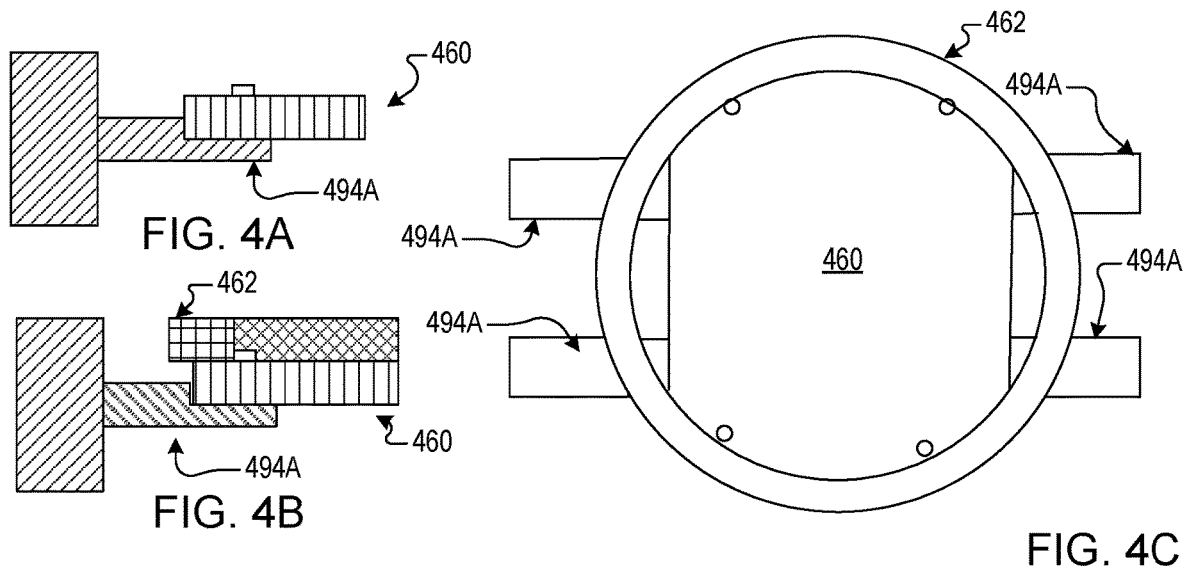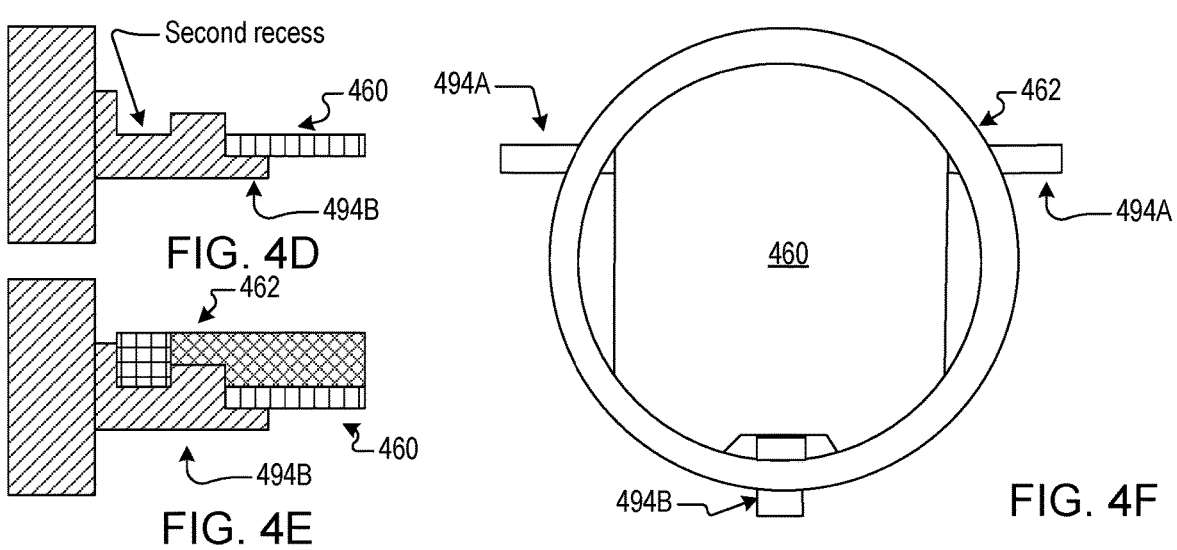

MULTI-OBJECT CAPABLE LOADLOCK SYSTEM

RELATED APPLICATION

This application claims benefit under 35 U.S.C. § 119(a) of Indian Patent Application No 201941029137, filed Jul. 19, 2019, the entire content of which is incorporated by reference herein.

TECHNICAL FIELD

Embodiments of the present disclosure relate to apparatuses and methods for process kit ring replacement in processing chambers, such as those used in wafer processing systems, and in particular to a multi-object capable loadlock system.

BACKGROUND

In semiconductor processing and other electronics processing, platforms are often used that use robotic arms to transport wafers from storage areas (e.g., front opening unified pods (FOUPs)) through a loadlock to a processing chamber, among processing chambers, from a processing chamber through the loadlock to a storage area, and so on.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes receiving, by a first loadlock chamber formed by a loadlock system of a wafer processing system, a first object from a factory interface of the wafer processing system via a first opening of the loadlock system. The first object is transferred into the first loadlock chamber via a first robot arm of the factory interface. The factory interface is at a first state. The first loadlock chamber is configured to receive different types of objects. The method may further include sealing a first loadlock door against the first opening to create a first sealed environment at the first state in the first loadlock chamber. The method may further include causing the first sealed environment of the first loadlock chamber to be changed to a second state that is different than the first state. The method may further include actuating a second loadlock door to provide a second opening between the first loadlock chamber and a transfer chamber of the wafer processing system. The first object is to be transferred from the first loadlock chamber to the transfer chamber via a second robot arm of the transfer chamber.

In another aspect of the disclosure, a multi-object capable loadlock system includes a first plurality of walls forming a first loadlock chamber of a wafer processing system. The first loadlock chamber is configured to be disposed between a factory interface of the wafer processing system and a transfer chamber of the wafer processing system. The factory interface is at a first state. The first loadlock chamber is configured to receive different types of objects. The multi-object capable loadlock system may further include one or more support structures disposed in the first loadlock chamber to support the different types of objects. The multi-object capable loadlock system may further include a first loadlock door coupled to a first opening of the first loadlock chamber. The first loadlock door is to be actuated to a first open position to enable a first robot arm of the factory interface to transfer a first object into the first loadlock chamber. The first loadlock door is to seal against the first opening to create a first sealed environment in the first loadlock chamber. The multi-object capable loadlock system may further include one or more ports coupled to the first plurality of walls to enable the first sealed environment of the first loadlock chamber to be changed from the first state to a second state that is different from the first state. The multi-object capable loadlock system may further include a second loadlock door coupled to a second opening of the first loadlock chamber. The second loadlock door is to be actuated to a second open position to enable a second robot arm of the transfer chamber to transfer the first object from the first loadlock chamber to the transfer chamber.

In another aspect of the disclosure, a process kit capable loadlock system includes a first plurality of walls forming a first loadlock chamber. The first loadlock chamber is configured to be disposed between a factory interface of a wafer processing system and a transfer chamber of the wafer processing system. The factory interface forms a first sealed environment at a first state and the transfer chamber forms a second sealed environment at a second state. The process kit capable loadlock system may further include a first loadlock door coupled to a first opening of the first loadlock chamber. The first loadlock door is to be actuated to a first open position to enable a first robot arm of the factory interface to transfer a first process kit ring into the first loadlock chamber. The first loadlock door is to seal against the first opening to create a third sealed environment in the first loadlock chamber at the first state. The process kit capable loadlock system may further include one or more ports coupled to the first plurality of walls to enable the third sealed environment of the first loadlock chamber to be changed from the first state to a third state that is different from the first state. The process kit capable loadlock system may further include a second loadlock door coupled to a second opening of the first loadlock chamber. The second loadlock door is to be actuated to a second open position to enable a second robot arm of the transfer chamber to transfer the first process kit ring from the first loadlock chamber to the transfer chamber to replace a used process kit ring.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A illustrates a cross-sectional side view of a processing system, according to certain embodiments.

FIG. 2B illustrates a front view of a loadlock system, according to certain embodiments.

FIG. 2C illustrates a support structure to be disposed in a loadlock system, according to certain embodiments.

FIGS. 3A-E illustrate support structures to support an object within a loadlock chamber of a loadlock system, according to certain embodiments.

FIGS. 4A-F illustrate an object disposed on one or more fins of a support structure disposed in a loadlock chamber of a loadlock system, according to certain embodiments.

DETAILED DESCRIPTION OF EMBODIMENTS

Figure 1:
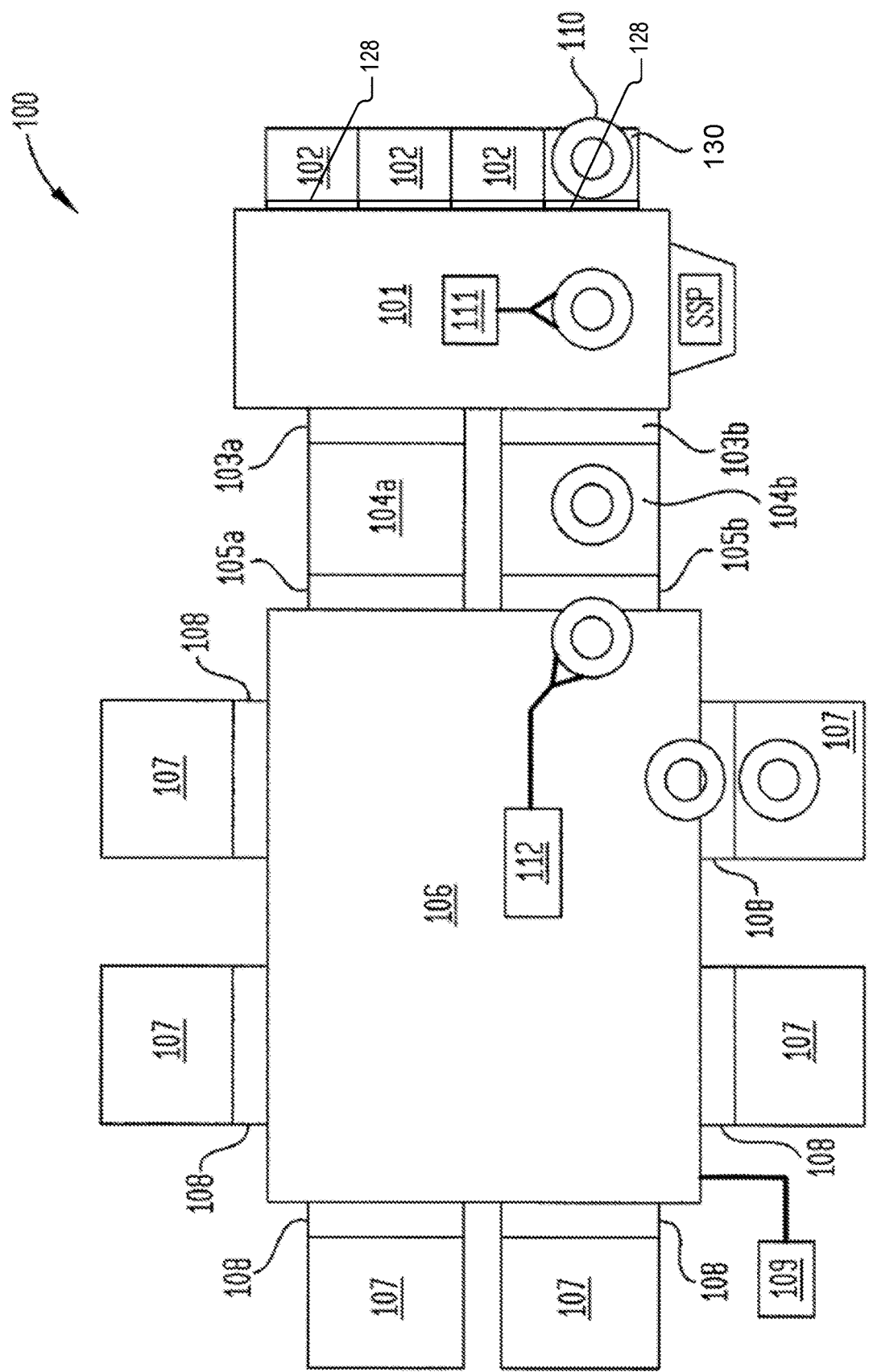
FIG. 1 illustrates a top view of a processing system, according to certain embodiments.

Embodiments described herein are related to a multi-object capable loadlock system. A multi-object capable loadlock system may be used in a processing system, such as a wafer processing system.

A processing system may include a storage area (e.g., FOUP) configured to store wafers and a factory interface that includes a robot arm configured to transfer the wafers from the storage area into the factory interface. The processing system may further include processing chambers configured to process the wafers and a transfer chamber that includes a robot arm configured to transfer wafers to the processing chambers and between processing chambers.

The factory interface (e.g., and storage area) may be kept at a first state (e.g., atmospheric pressure) and the transfer chamber (e.g., and processing chambers) may be kept at a second state (e.g., vacuum, below atmospheric pressure) to avoid contamination of one or more portions of the processing system and to avoid abnormalities (e.g., oxidation, contamination, defects) in the wafers and/or non-uniformities in the processing. The processing system may include a loadlock used to maintain the factory interface at a first state and the transfer chamber at the second state. The loadlock may include a first loadlock door configured to seal a loadlock chamber of the loadlock from the factory interface and a second loadlock door configured to seal the loadlock chamber from the transfer chamber. To transfer a wafer from the factory interface to the transfer chamber, the loadlock may open the first loadlock door while maintaining the second loadlock door closed, receive a wafer from the factory interface via the robot arm of the factory interface, close the first loadlock door to create the sealed environment, change the state of the sealed environment of the loadlock chamber (e.g., from atmospheric pressure to vacuum), and open the second loadlock door so that the wafer can be transferred into the transfer chamber.

The robot arm of the transfer chamber can transfer the wafers received via the loadlock into the processing chambers. A gas may be used to etch a wafer in a processing chamber (e.g., a wafer may be etched while electrostatically clamped in position in an etch chamber). One or more process kit rings may surround a wafer and/or portions of wafer support assemblies in a processing chamber to protect components (e.g., to protect the wafer support assembly) of the processing chamber and/or the wafer. For example, a circular part, referred to as an edge ring or process kit ring, is positioned immediately outside of the outer diameter of the substrate to protect the upper surface of a chuck (e.g., an electrostatic chuck) supporting the substrate from being etched by etchant chemistry. Process kit rings are made from several different materials and can have different shapes, both of which affect process uniformity near the process kit ring. During processing (e.g., as the substrates are etched by etchant chemistry), the process kit rings deteriorate (e.g., are etched) over time and result in shape changes as well as changes in processing uniformity (e.g., non-uniformity in processed substrates, non-uniformity in processes, etc.). To address the changes in processing uniformity due to process kit ring deterioration, process kit rings are replaced according to a schedule.

Conventional loadlocks have openings and a chamber that are sized to accommodate the height of the end effector of a robot arm plus the very small height (e.g., about 0.75 millimeters (mm)) of the wafer. Conventional loadlocks are also configured to accommodate the planar bottom surface of a wafer. Process kit rings have a size and shape that is much different than those of wafers. Process kit rings are much taller than wafers (e.g., a process kit ring may be 10 mm tall in addition to the height of the carrier). A bottom surface of a process kit ring is different than a bottom surface of a wafer. A bottom surface of a carrier on which a process kit ring may be disposed is also different than a bottom surface of a wafer. Conventional loadlocks are used only to transfer wafers and cannot receive objects (e.g., process kit rings, carriers, etc.) other than a wafer.

Conventionally, to replace a process kit ring, an operator opens a processing chamber to have access to the process kit ring inside, manually removes and replaces the process kit ring, and closes the processing chamber. While the processing chamber is open, the processing chamber and the processing system may become contaminated (e.g., with cells, hair, dust, etc.). The processing chamber and/or processing system then goes through a requalification process that may remove the processing chamber and/or processing system from operation for days to weeks. This impacts line yield, scheduling, energy used, user time, quality (e.g., responsive to adding variables to the system), and so forth.

The devices, systems, and methods disclosed herein use a multi-object capable loadlock system to enable automated replacement of process kit rings (e.g., without opening a processing chamber). A loadlock chamber formed by a loadlock system of a wafer processing system may receive a first object from a factory interface of the wafer processing system via a first opening of the loadlock system. The loadlock chamber may be configured (e.g., sized, shaped, include features) to receive different types of objects such as (e.g., the first object may include any of the following) a wafer, a process kit ring, an empty carrier, a process kit ring on a carrier, a placement validation wafer, or the like. The first object may be transferred to the loadlock chamber via a first robot arm of the factory interface. The factory interface (and the loadlock chamber open to the factory interface) may be at a first state (e.g., atmospheric pressure). A first loadlock door may seal against the first opening to create a sealed environment at the first state (e.g., atmospheric pressure) in the loadlock chamber. The first sealed environment (e.g., via one or more ports, such as purge adaptors, gas inlets, etc.) may be changed from the first state to a second state (e.g., changed from atmospheric pressure to vacuum) that is different than the first state. The second state may be the same as or similar to a state of the transfer chamber (e.g., the pressure level of the loadlock chamber may be changed to a vacuum level substantially similar to that of the transfer chamber). In some embodiments, temperature of the loadlock chamber and/or the first object in the loadlock chamber may be controlled. For example, a process kit ring may be heated (e.g., using a heater in the loadlock chamber) to be thermally expanded prior to being transferred into the transfer chamber to assist in fitting the process kit ring into position in a processing chamber. A second loadlock door may be actuated to provide a second opening between the loadlock chamber and the transfer chamber. The first object may be transferred from the loadlock chamber to the transfer chamber via a second robot arm of the transfer chamber. The second robot arm may transfer the first object into a processing chamber. By transferring the first object from the factory interface (e.g., from a storage area) to the processing chamber via the multi-object capable loadlock system, the wafer processing system may avoid contamination and avoid a requalification process (associated with opening of a transfer chamber and/or processing chamber).

A second object may be transferred by the second robot arm of the transfer chamber into the loadlock chamber. The second loadlock door may be sealed against the second opening to create the sealed environment at a third state (e.g., same as the transfer chamber, such as vacuum, similar to the second state). The sealed environment in the loadlock chamber may be changed to a fourth state (e.g., similar to the first state). In some embodiments, the loadlock chamber may be filled with a gas (e.g., nitrogen, helium) to a pressure level similar to or the same as the pressure level (e.g., atmospheric pressure) of the factory interface. In some embodiments, the temperature of the sealed environment and/or the second object may be controlled. For example, a process kit ring or a wafer may be cooled (e.g., using one or more cooling elements in the loadlock chamber) prior to transferring to the factory interface (e.g., to avoid oxidation of the wafer, to avoid heating the environment in the factory interface, etc.). The first loadlock door may be actuated to provide the first opening between the loadlock chamber and the factory interface. The first robot arm of the factory interface may transfer the second object from the loadlock chamber into the factory interface. The first robot arm may transfer the second object from the factory interface into the storage area (e.g., FOUP).

The loadlock chamber may have one or more support structures (e.g., sets of fins, pins, etc.) that are configured to support different types of objects. A support structure may provide a kinematic coupling between a portion of the support structure and a corresponding bottom surface of one or more of the different types of objects. For example, a bottom surface of one or more of the objects may have features (e.g., cone-shaped structures) that align with features on sets of fins and/or with tops of pins disposed in the loadlock chamber. The kinematic coupling provided by the one or more support structures may align the different types of objects within the loadlock chamber for transfer into the factory interface and/or transfer chamber. The one or more support structures may support one or more objects in the loadlock chamber. For example, a support structure in a loadlock chamber may include a comb structure including multiple sets of horizontal fins, where a first object may be disposed on a first set of horizontal fins and a second object may be disposed on a second set of horizontal fins.

The multi-object capable loadlock system may form one or more loadlock chambers that each have one or more corresponding first and second loadlock doors, first and second openings, one or more support structures (e.g., sets of fins, pins), one or more ports, etc. The loadlock chambers may stacked on top of each other. Multiple loadlock chambers may improve throughput of the wafer processing system. In some embodiments, a first loadlock chamber is for transferring wafers and a second loadlock chamber is for transferring process kit rings, carriers, and placement validation wafers. In some embodiments, a first loadlock chamber is for transferring objects from the factory interface to the transfer chamber and a second loadlock chamber is for transferring objects from the transfer chamber to the factory interface. In some embodiments, a first loadlock chamber is for transferring process kit rings, carriers, and/or placement validation wafers in either direction between the factory interface and the transfer chamber and/or for transferring wafers from the factory interface to the transfer chamber and the second loadlock chamber is for transferring wafers from the transfer chamber into the factory interface. In some embodiments, a loadlock chamber is coupled to a heating device and objects that are to be heated (e.g., new process kit rings, wafers to be processed, etc. that are being transferred from the factory interface to the transfer chamber) are transferred through the loadlock chamber. In some embodiments, a loadlock chamber is coupled to a cooling device (e.g., cooling plate) and objects that are to be cooled (e.g., used process kit rings, processed wafers, etc. that are being transferred from the transfer chamber to the factory interface) are transferred through the loadlock chamber. In some embodiments, certain objects (e.g., used process kit rings) are transferred through a specific loadlock chamber to avoid contamination of other objects. In some embodiments, the different loadlock chambers of the multi-object capable loadlock system have different sizes and/or support structures for transferring objects specific to that loadlock chamber.

In some embodiments, a first carrier that is empty (e.g., no process kit ring on the carrier) may be transferred from the factory interface via the multi-object capable loadlock system to the transfer chamber, a used process kit ring on the first carrier may be transferred from the transfer chamber via the multi-object capable loadlock system to the factory interface, a new process kit ring (e.g., on a second carrier) may be transferred from the factory interface via the multi-object capable loadlock system to the transfer chamber to replace the used process kit ring, and a placement validation wafer may be transferred from the factory interface via the multi-object capable loadlock system to the transfer chamber for validation of placement of the new process kit ring, and the placement validation wafer may be transferred from the transfer chamber via the multi-object capable loadlock system to the factory interface. A process kit ring may be replaced and validated without contaminating the processing chamber (e.g., without opening the processing chamber) and without the corresponding requalification process.

The devices, systems, and methods disclosed herein have advantages over conventional solutions. The multi-object capable loadlock system may interface with a factory interface and transfer chamber of the wafer processing system and enable removal, replacement, and verification of placement of process kit rings without opening of a processing chamber and without a subsequent requalification process of the processing chamber associated with conventional systems. The multi-object capable loadlock system may provide a sealed environment and may cause the state of the sealed environment to be changed to enable one or more of substantially matching a corresponding state of the factory interface or the transfer chamber, changing of the temperature and/or thermal expansion of an object, preventing contamination, or maintaining the states of the factory interface and transfer chamber. The multi-object capable loadlock system may have one or more support structures to optionally provide kinematic coupling with one or more objects transferred through the multi-object capable loadlock system (e.g., for alignment of the one or more objects). Use of the multi-object capable loadlock system to replace process kit rings has less impact on line yield, scheduling, quality, user time, energy used, and so forth than conventional solutions.

FIG. 1 illustrates a processing system 100 (e.g., a wafer processing system), according to one aspect of the disclosure. The processing system 100 includes a factory interface 101 that includes multiple load ports 128 to which cassettes (e.g., FOUPs) 102 may be coupled for transferring wafers and/or other substrates into and out of the processing system 100. The factory interface may also include an enclosure system 130 (e.g., process kit enclosure system, cassette, FOUP, etc.) coupled to a load port 128 for transferring content 110 such as process kit rings into and out of the processing system 100.

A load port 128 may include a front interface that forms a vertical opening. The load port 128 may also have a horizontal surface. A FOUP may have a front interface that forms a vertical opening. The front interface of the FOUP may be sized to interface with the front interface of the load port 128 (e.g., the vertical opening of the FOUP may be approximately the same size as the vertical opening of the load port 128). The FOUP may be placed on the horizontal surface of the load port 128 and the vertical opening of the FOUP may align with the vertical opening of the load port 128. The front interface of the FOUP may interconnect with (e.g., clamp to, be secured to, be sealed to) the front interface of the load port 128. A bottom plate (e.g., base plate) of the FOUP may have features (e.g., load features, such as recesses, that engage with load port kinematic pin features, a load port datum pin clearance, and/or a FOUP docking tray latch clamping feature) that engage with the horizontal surface of the load port 128. The enclosure system 130 (e.g., process kit enclosure system) has a front interface that is also sized to interface with the front interface of the load port 128. The enclosure system 130 may be placed on the horizontal surface of the load port 128 and the vertical opening of the enclosure system 130 may align with the vertical opening of the load port 128. The front interface of the enclosure system 130 may interconnect with the front interface of the load port 128. The enclosure system 130 has a base plate that has features to engage with the horizontal surface of the load port 128. The enclosure system 130 may interface with the same load ports 128 that are used for FOUPs and cassettes that contain wafers.

The enclosure system 130 may include one or more items of content 110 (e.g., one or more of a process kit ring, an empty process kit ring carrier, a process kit ring disposed on a process kit ring carrier, a placement validation wafer, etc.). For example, the enclosure system 130 may be coupled to the factory interface 101 (e.g., load port 128) to enable automated transfer of a process kit ring on a process kit ring carrier into the processing system 100 for replacement of a used process kit ring.

The processing system 100 may also include first vacuum ports 103a, 103b (e.g., first loadlock doors) coupling the factory interface 101 to respective degassing chambers 104a, 104b (e.g., loadlock chambers, multi-object capable loadlock systems). Second vacuum ports 105a, 105b (e.g., second loadlock doors) may be coupled to respective degassing chambers 104a, 104b and disposed between the degassing chambers 104a, 104b and a transfer chamber 106 to facilitate transfer of wafers and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 may include a single degassing chamber 104, a single first vacuum port 103, and a single second vacuum port 105). In some embodiments, a first loadlock system forms degassing chamber 104a and a second loadlock system forms degassing chamber 104b. In some embodiments, a single loadlock system forms degassing chambers 104a and 104b (e.g., one degassing chamber stacked on top of the other).

The transfer chamber 106 includes a plurality of processing chambers 107 (e.g., four processing chambers 107, six processing chambers, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure. Each degassing chamber 104 (e.g., load lock, pressure chamber) may have a first loadlock door (e.g., first vacuum port 103) to seal the degassing chamber 104 from the factory interface 101 and a second loadlock door (e.g., second vacuum port 105) to seal the degassing chamber 104 from the transfer chamber 106. Content may be transferred from the factory interface 101 into a degassing chamber 104 while the first loadlock door is open and the second loadlock door is closed, the first loadlock door may close, the pressure in the degassing chamber 104 may reduce to match the transfer chamber 106, the second loadlock door may open, and the content may be transferred out of the degassing chamber 104. A local center finding (LCF) device may be used to align the content in the transfer chamber 106 (e.g., before entering a processing chamber 107, after leaving the processing chamber 107).

The processing chambers 107 may include or more of etch chambers, deposition chambers (including atomic layer deposition, chemical vapor deposition, physical vapor deposition, or plasma enhanced versions thereof), anneal chambers, and the like. Some of the processing chambers 107, such as etch chambers, may include process kit rings (e.g., edge ring, processing ring, support ring, sliding ring, quartz ring, etc.) therein, which occasionally are to be replaced. While conventional systems are associated with disassembly of a processing chamber by an operator to replace a process kit ring, the processing system 100 is configured to facilitate replacement of process kit rings without disassembly of a processing chamber 107 by an operator.

Factory interface 101 includes a factory interface robot 111. Factory interface robot 111 may include a robot arm, and may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm. The end effector may be configured to pick up and handle specific objects, such as wafers. Alternatively, the end effector may be configured to handle objects such as process kit rings (edge rings). The factory interface robot 111 may be configured to transfer objects between cassettes 102 (e.g., FOUPs) and degassing chambers 104a, 104b.

Transfer chamber 106 includes a transfer chamber robot 112. Transfer chamber robot 112 may include a robot arm with an end effector at an end of the robot arm. The end effector may be configured to handle particular objects, such as wafers. The transfer chamber robot 112 may be a SCARA robot, but may have fewer links and/or fewer degrees of freedom than the factory interface robot 111 in some embodiments.

A controller 109 controls various aspects of the processing system 100. The controller 109 may be and/or include a computing device such as a personal computer, a server computer, a programmable logic controller (PLC), a microcontroller, and so on. The controller 109 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 109 may include a data storage device (e.g., one or more disk drives and/or solid state drives), a main memory, a static memory, a network interface, and/or other components. The controller 109 may execute instructions to perform any one or more of the methods or processes described herein. The instructions may be stored on a computer readable storage medium, which may include the main memory, static memory, secondary storage and/or processing device (during execution of the instructions). The controller 109 may receive signals from and send controls to factory interface robot 111 and wafer transfer chamber robot 112 in embodiments.

FIG. 1 schematically illustrates transfer of content 110 (e.g., a process kit ring coupled to a process kit ring carrier, an empty carrier, a process kit ring without a carrier, a placement validation wafer, etc.) into a processing chamber 107. According to one aspect of the disclosure, content 110 is removed from an enclosure system 130 via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 may be transferred to a processing chamber 107 though a respective port 108. While not shown for clarity in FIG. 1, transfer of the content 110 may include transfer of a process kit ring disposed on a process kit ring carrier, transfer of an empty process kit ring carrier, transfer of a placement validation wafer, etc.

FIG. 1 illustrates one example of transfer of content 110, however, other examples are also contemplated. For example, it is contemplated that the enclosure system 130 may be coupled to the transfer chamber 106 (e.g., via a load port in the transfer chamber 106). From the transfer chamber 106, the content 110 may be loaded into a processing chamber 107 by the transfer chamber robot 112. Additionally, content 110 may be loaded in a substrate support pedestal (SSP). An additional SSP may be positioned in communication with the factory interface 101 opposite the illustrated SSP. It is contemplated that a processed content 110 (e.g., a used process kit ring) may be removed from the processing system 100 in reverse of any manner described herein. When utilizing multiple process kit enclosure systems 130 or a combination of enclosure system 130 and SSP, it is contemplated that one SSP or enclosure system 130 may be used for unprocessed content 110 (e.g., new process kit rings), while another SSP or enclosure system 130 may be used for receiving processed content 110 (e.g., used process kit rings).

In some embodiments, a process kit ring that is secured to an upper surface of a process kit ring carrier may be stored in the enclosure system 130 and factory interface robot 111 may insert an end effector of the factory interface robot 111 into the enclosure system 130 below the process kit ring carrier, lift the process kit ring carrier, and extract from the enclosure system 130 to transport the process kit ring secured to the process kit ring carrier on the robot within the processing system 100 via a degassing chamber 104 (e.g., loadlock). In some embodiments, a process kit ring is stored within the process kit enclosure system 200 (e.g., without being secured to a process kit ring carrier). Factory interface robot 111 may obtain an empty process kit ring carrier from within the processing system 100 or the enclosure system 130 and may use the empty process kit ring carrier to remove the process kit ring from the enclosure system 130 to transport the process kit ring secured to the process kit ring carrier within the processing system 100. In some embodiments, factory interface robot 111 may retrieve a process kit ring from an enclosure system 130 and transport the process kit ring within the processing system 100 without use of a process kit ring carrier.

FIG. 2A illustrates a cross-sectional side view of a processing system 200 (e.g., processing system 100 of FIG. 1), according to certain aspects of the disclosure. The processing system 200 may include a loadlock system 204 (e.g., degassing chamber 104a or 104b of FIG. 1). The processing system 200 may further include a factory interface 201 (e.g., factory interface 101 of FIG. 1), a load port 228 (e.g., 128 of FIG. 1), an enclosure system 230 (e.g., enclosure system 130 of FIG. 1), a transfer chamber 206 (e.g., 106 of FIG. 1), and a processing chamber 107 (e.g., 107 of FIG. 1). The factory interface 201 may include a robot arm 211 (e.g., factory interface robot 111 of FIG. 1). The transfer chamber 206 may include a robot arm 212 (e.g., transfer chamber robot 112 of FIG. 1). The enclosure system 230 and factory interface 201 may be at a first state (e.g., atmospheric pressure, etc.) and the transfer chamber 206 and processing chamber 207 may be at a second state (e.g., vacuum, lower pressure than the factory interface 201).

The loadlock system 204 may include one or more sets of walls that each form a corresponding loadlock chamber 240. In some embodiment, loadlock system 204 forms only one loadlock chamber 240. In some embodiments, loadlock system forms two loadlock chambers 240. In some embodiments, loadlock system 204 forms more than two loadlock chambers 240. Each loadlock chamber 240 may be configured to be disposed between the factory interface 201 and the transfer chamber 206 for transfer of one or more types of objects (e.g., two or more types of objects) between the factory interface 201 and the transfer chamber 206. One or more support structures 242 (e.g., fins, pins, comb structures, etc.) may be disposed in one or more of the loadlock chambers 240 to support the one or more different types of objects.

For each loadlock chamber 240, the loadlock system 204 may include a first loadlock door 203 (e.g., vacuum port 103 of FIG. 1) that separates the loadlock chamber 240 from the factory interface 201 and a second loadlock door 205 (e.g., vacuum port 105 of FIG. 1) that separates the loadlock chamber 240 from the transfer chamber 206. For each loadlock chamber 240, the first loadlock door 203 may be coupled to a first opening of the loadlock chamber 240 and the first loadlock door 203 may be actuated to a first open position to enable a robot arm 211 to transfer an object between the factory interface 201 and the loadlock chamber 240. For each loadlock chamber 240, the second loadlock door 205 may be coupled to a second opening of the loadlock chamber 240 and the second loadlock door 205 may be actuated to a second open position to enable a robot arm 212 to transfer an object between the transfer chamber 206 and the loadlock chamber 240. For each loadlock chamber 240, the first loadlock door 203 may seal against the first opening and the second loadlock door 205 may seal against the second opening to create a sealed environment in the loadlock chamber 240. The loadlock doors may seal via a corresponding gasket or O-ring.

For each loadlock chamber 240, the loadlock system 204 may include one or more ports 244 coupled to the corresponding walls to enable the sealed environment of the loadlock chamber 240 to be changed from a state to a different state (e.g., different pressure, different type of gas, different temperature, etc.). The ports 244 may be used for one or more of removing gas from the loadlock chamber 240, filling the loadlock chamber with a gas, etc.

The loadlock system 204 may include a temperature controlling device (e.g., cooling plate, heating plate, etc.) that are coupled to a loadlock chamber to control temperature of the loadlock chamber and/or the object disposed in the loadlock chamber 240. In some embodiments, an object transferred from the transfer chamber 206, through the loadlock chamber 240, to the factory interface 201 (e.g., used process kit ring, processed wafer, etc.) may be cooled (e.g., to avoid oxidation of the wafer, to avoid changing of the state of the factory interface, to avoid damage of components such as support structures in the enclosure system). In some embodiments, an object transferred from the factory interface 201, through the loadlock chamber 240, to the transfer chamber 206 (e.g., new process kit ring, wafer to be processed, etc.) may be heated (e.g., to provide thermal expansion of the object to better fit in the processing chamber, etc.). In some embodiments, lift pins may be oriented through the temperature controlling device (e.g., through the cooling plate) for lifting the object.

In some embodiments, the loadlock system 204 is a multi-object loadlock system that is capable of transferring different types of objects between the factory interface 201 and the transfer chamber 206. For example, a multi-object loadlock system may be capable of transferring two or more of a wafer, process kit ring, an empty carrier, a process kit ring disposed on a carrier, or a placement validation wafer. In some embodiments, the loadlock system 204 is a process kit ring capable loadlock system that is capable of transferring at least a process kit ring between the factory interface 201 and the transfer chamber 206. In some embodiments, a loadlock chamber 240 of the loadlock system 204 is configured to receive one or more objects that are greater than 1 mm (millimeter), 5-10 mm, 5-15 mm, 10-15 mm, or greater than 15 mm in height.

The enclosure system 230 (e.g., FOUP, process kit enclosure system) may interface with (e.g., seal against) the load port 228. A door of one or more of the enclosure system 230 and/or a door of the load port 228 may open to create an opening between the enclosure system 230 and the factory interface 201. The enclosure system 230 and factory interface 201 may form a sealed environment that is at a first state (e.g., atmospheric pressure). The first loadlock door 203 may be actuated to an open position while the second loadlock door 205 is in a closed position, causing the loadlock chamber 240, factory interface 201, and enclosure system 230 to be part of a sealed environment at the first state.

The robot arm 211 (e.g., atmospheric robot) may extend from the factory interface 201 into the enclosure system 230 to lift an object (e.g., a process kit ring, carrier, placement validation wafer) and may transfer the object through the factory interface 201 into the loadlock chamber 240 (e.g., through an opening responsive to the first loadlock door 203 being in an open position). The first loadlock door 203 may close to be sealed against the first opening to create a sealed environment at the first state in the loadlock chamber 240. The ports 244 may be used to change loadlock chamber 240 to a different state (e.g., vacuum, substantially similar to the state of the transfer chamber 206).

The second loadlock door 205 may be opened and the robot arm 212 (e.g., vacuum robot) may extend from the transfer chamber 206 into the loadlock chamber 240 to lift the object from the support structure 242. The robot arm 212 may transfer the object from the loadlock chamber, through the transfer chamber 206, into a processing chamber 207. The robot arm 212 may place the object on one or more support structures (e.g., pins) in the processing chamber 207.

In some embodiments, the enclosure system 230 may include one or more empty carriers, one or more new process kit rings (e.g., disposed on carriers), and a placement validation wafer (e.g., a wafer with a camera, a wafer with a light reflection detector, etc.). The processing system 200 may transfer a carrier that is empty from the enclosure system 130 through the loadlock system 204 (e.g., loadlock chamber 240) (e.g., in addition to through the factory interface 201 and transfer chamber 206) to the processing chamber 207. The processing system 200 may place a used process kit ring on the carrier (e.g., using lift pins in the processing chamber 207) in the processing chamber 207 and the processing system 200 may transfer the used process kit ring on the carrier through the loadlock system 204 (e.g., loadlock chamber 240) into the enclosure system 230 (e.g., to be disposed on one or more support structures in the enclosure system 230). The processing system 200 may transfer a new process kit ring (e.g., on a carrier) from the enclosure system 230, through the loadlock system 204, and into the processing chamber 207 to replace the used process kit ring that was removed from the processing chamber 207 (e.g., by extending lift pins in the processing chamber 207 to remove the new process kit ring from the robot arm 212, removing the robot arm 212, and lowering the lift pins). Responsive to the new process kit ring being transferred on a carrier, the carrier which is now empty, may be transferred from the processing chamber 207, through the loadlock system 204 (e.g., loadlock chamber 240) into the enclosure system (e.g., to be disposed on a support structure in the enclosure system). The processing system 200 may transfer a placement validation wafer from the enclosure system 230, through the loadlock system 204 (e.g., loadlock chamber 240) into the processing chamber 207 to validate the placement of the new process kit ring in the processing chamber 207.

In some embodiments, the support structure 242 may support more than one object. In some embodiments, a carrier that is empty may be transferred from the enclosure system 230 to a first set of fins of the support structure 242 in the loadlock chamber 240 and a processing kit ring (e.g., on a carrier) may be transferred to a second set of fins of the support structure 242. The first loadlock door 203 may be actuated to a closed position with both objects in the loadlock chamber 240A. In some embodiments, the empty carrier may be transferred from the first set of fins of the support structure 242 into the processing chamber 207, the used process kit ring on the carrier (that was empty) may be transferred into the loadlock chamber 240 onto the first set of fins, and the new processing kit ring (e.g., on another carrier) may be transferred into the processing chamber 207 to replace the used process kit ring. By supporting more than one object on the support structure 242 in the loadlock chamber 240, the state (e.g., pressure, temperature, type of gas, etc.) of the loadlock chamber 240 may be changed less often, resulting in one or more of less energy consumption, less processor overhead, less gas, less wear and tear on the equipment, less maintenance, or the like.

The loadlock system 204 may include one or more loadlock chambers 240 that are sized, shaped, and configured to have specific types of objects transferred through the loadlock chamber 240. A loadlock chamber 240A may be sized for one or more of a carrier, a process kit ring without a carrier, a process kit ring disposed on a carrier, or a placement validation wafer to be transferred through the first loadlock chamber 240A. Loadlock chamber 240B may be sized for transferring of wafers.

FIG. 2B illustrates a front view of a loadlock system 204, according to certain embodiments. Loadlock system 204 may form one or more loadlock chambers 240. Each loadlock chamber 240 may include a support structure 242. A support structure may support one or more objects. In some embodiments, the support structure may be configured to provide a kinematic coupling with one or more objects to align the one or more objects.

In some embodiments, a support structure 242 includes one or more sets of fins. Each set of fins may support an object. A first object may be placed on a first set of fins by a robot arm (e.g., robot arm 211, robot arm 212) and a second object may be placed on a second set of fins by a robot arm.

In some embodiments, a support structure 242 includes pins. The pins may extend from a bottom surface (e.g., bottom chamber surface) of a loadlock chamber 240 to support an object. An object may be placed on the pins by a robot arm (e.g., robot arm 211, robot arm 212).

In some embodiments, a support structure 242 disposed in a loadlock chamber 240 includes one or more sets of fins and one or more pins that extend from the bottom surface of the loadlock chamber 240. A first object may be disposed on a first set of fins and a second object may be disposed on the bottom surface of the loadlock chamber 240. To transfer the second object, the second object may be raised via the pins above the bottom surface of the loadlock chamber 240.

FIG. 2C illustrates a support structure 242 (e.g., to be disposed in a loadlock chamber 240), according to certain embodiments. In some embodiments, the support structure 242 includes vertical components 250, one or more sets of fins 252, and a bridge bracket 254. The bridge bracket 254 may prevent deflection of the vertical components 250. The support structure may be disposed within a loadlock chamber 240 of a loadlock system 204.

In some embodiments, a lower surface of the vertical components 250 is coupled to a hoop that is disposed on the bottom surface of the loadlock chamber 240. The hoop may have a support base (e.g., a larger portion of the hoop) to stabilize the hoop (e.g., avoid deflection).

Each set of fins 252 may support an object, such as a carrier 260 (e.g., process kit ring carrier, process kit ring adaptor) that is empty, a process kit ring 262 (e.g., new or used) on a carrier 260, or a placement validation wafer 264, or a wafer. Each set of fins 252 may be sized, spaced, and configured to support one or more types of objects and to allow a robot arm (e.g., end effector of robot arm 211 or 212) to lift the object from the set of fins 252 and place the object on the set of fins 252. Each set of fins 252 may provide kinematic coupling with the object disposed on the set of fins 252.

FIGS. 3A-E illustrate support structures to support an object within a loadlock chamber of a loadlock system, according to certain embodiments. In some embodiments, the support structures in FIGS. 3A-E provide kinematic coupling with an object disposed on the support structurer to align the object. Each object may be aligned by one or more of the kinematic coupling with the support structure or an alignment device (e.g., aligner device, local center finder (LCF) device). Although certain types of objects may be illustrated in FIGS. 3A-E, the support structures in FIGS. 3A-E may be used with different objects.

FIG. 3A illustrates a cross-sectional view of a pin contact 302 on a fin 352 (e.g., fin 252 of FIG. 2C), according to certain embodiments. In some embodiments, the pin contact 302 may be a polyethylene terephthalate (PET) insert. In some embodiments, each fin 352 has a pin contact 302. The sidewall of the pin contact 302 may be sloped (e.g., narrower further away from the fin 352 and wider closer to the fin 352, a sloped sidewall). A portion of the sidewall proximate the top of the pin contact 302 may be curved (e.g., tapered). A draft angle of the sloped sidewall may allow for an object (e.g., process kit ring 362, process kit ring 262 of FIG. 2C) to have error upon being lowered onto the fin 352 of the support structure and may guide the object into place (e.g., to a target position on the fin 352). The sidewall of the pin contact 302 may have a first coefficient of friction (e.g., low coefficient of friction) to allow sliding on entry. A substantially horizontal surface of the pin contact 302 on which the object (e.g., process kit ring 362) is disposed (e.g., proximate the sidewalls of the pin contact 302) may have a second coefficient of friction (e.g., a high coefficient of friction, a coefficient of friction that is higher than the first coefficient of friction of the sidewalls) to prevent sliding and shifting (e.g., to prevent horizontal movement) of the object (e.g., on the end effector of the robot arm 211, 212). In some embodiments, a carrier 360 (e.g., carrier 260 of FIG. 3C) and/or a placement validation wafer (e.g., placement validation wafer 264 of FIG. 2C) may have a feature (e.g., notch, sidewall, etc.) that interfaces with (e.g., has a kinematic coupling) with the pin contact 302.

FIG. 3B illustrates a cross-sectional view of a fin 352 that forms a recess 304 (e.g., notch), according to certain embodiments. The recess 304 may have a substantially horizontal surface to support the bottom surface of the object (e.g., process kit ring 362). The recess 304 may have a sloped sidewall (e.g., have a draft angle, a guide taper) to allow for the object to have error upon being lowered onto the fin 352 and may guide the object into place. In some embodiments, a carrier 360 (e.g., carrier 260 of FIG. 3C) and/or a placement validation wafer (e.g., placement validation wafer 264 of FIG. 2C) may have a feature (e.g., notch, sidewall, etc.) that interfaces with (e.g., has a kinematic coupling) with the recess 304.

FIG. 3C illustrates a cross-sectional view of a fin 352 that interfaces with an object (e.g., carrier 360), according to certain embodiments. A lower surface of the object (e.g., carrier 360) may form one or more recesses and an upper surface of the fin 352 may form one or more features (e.g., extrusions, pin contact, etc.) that are sized and shaped (e.g., cone shape, dowel shape, etc.) to interface with each other (e.g., to prevent movement of the carrier 360 on the fin 352). The sidewall of the feature or the sidewall of the recess may be sloped (e.g., a guide taper) to allow for alignment error (e.g., upon lowering the carrier 360 on the fin 352). The carrier 360 may have a recess similar to recess 304 of FIG. 3B to interface with a process kit ring 362. In addition to or as an alternative to a feature (e.g., extrusion, pin contact) on the fin 352, a recess may be disposed in the fin 352 (e.g., on the upper surface of the fin 352) that aligns with a feature in the lower surface of an object. In some embodiments, a process kit ring 362 and/or a placement validation wafer (e.g., placement validation wafer 264 of FIG. 2C) may have a recess that interfaces with (e.g., has a kinematic coupling) with the feature (e.g., extrusion) of fin 352.

FIG. 3D illustrates a cross-sectional view of a fin 352 that interfaces with an object (e.g., carrier 360), according to certain embodiments. One or more mechanical safety guides 306 (e.g., protrusion, pin contact, etc.) may be disposed on a lower surface of the object (e.g., carrier 360). A mechanical safety guide 306 may interface with a recess 316 formed by an upper surface of the fin 352. The mechanical safety guide 306 interfacing with a recess 316 may allow for alignment error (e.g., upon lowering the carrier 360 onto the fin 352). The mechanical safety guide 306 interfacing with a recess 316 may prevent movement of the carrier 360 (e.g., not slip off fin 352 despite vibration of the loadlock system). In some embodiments, a process kit ring 362 and/or a placement validation wafer (e.g., placement validation wafer 264 of FIG. 2C) may have a mechanical safety guide 306 that interfaces with (e.g., has a kinematic coupling) with the recess 316 of fin 352.

FIG. 3E illustrates a cross-sectional view of an object (e.g., carrier 360 with a lift pin interface) that interfaces with a lift pin 318 (e.g., carrier lift pin, wafer lift pin), according to certain embodiments. The lift pin 318 may be a wafer lift pin (e.g., used for lifting wafers in process chambers). A receptacle 319 may be formed in a lower surface of the object (e.g., carrier 360) to receive the lift pin 318. The receptacle 319 includes a body 330 having a cylindrical shape and a flared base 331 at one end of the body 330. In some embodiments, the body 330 is disposed through the object (e.g., carrier 360) and in some embodiments, the body is embedded in the lower surface of the object (e.g., does not extend through). The flared base 331 may be partially positioned in and contact a counterbore formed on a lower surface of the object (e.g., carrier 360). The receptacle 319 may include a first recess 332 extending into the body 330 and a counterbore 333 formed in the flare base 331. The recess 332 and the counterbore 333 may be coupled by a tapering sidewall 334 to facilitate feature engagement (e.g., kinematic coupling, engagement with lift pin 318). In one example, the recess 222 has an oblong or parabolic shape to accommodate a diametrical alignment feature. In such an example, the recess 332 may have a greater width in a direction parallel to the two substantially parallel edges of the perimeter of the object (e.g., carrier 360) (as opposed to a direction perpendicular to the two substantially parallel edges). The parabolic or oblong shape of the recess 332 may facilitate accommodation of the lift pin 318 within the recess 332. In some embodiments, the an upper surface of the lift pin 318 forms a recess (e.g., inverted cone) and the receptacle 319 forms a protrusion that interfaces with the recess in the lift pin 318.

FIGS. 4A-F illustrate an object (e.g., carrier 460) disposed on one or more fins 494 (e.g., of a support structure disposed in a loadlock chamber of a loadlock system), according to certain embodiments. The fins 494 may provide kinematic coupling with the object. In some embodiments, the object (e.g., carrier 460) has a planar bottom surface on a first plane and has one or more features (e.g., extrusions, pads) that extend from the first plane. For example, the object (e.g., carrier 460) may have one or more pads that wrap from a side surface of the object to a bottom surface of the object. Each fin 494 may have a recess (e.g., slot) to receive the feature (e.g., pad) of the object. In some embodiments, only the features of the object engage with the fin (e.g., the planar bottom surface of the object does not engage with the fins 494). In some embodiments, the recesses of the fins 494 (that receive the pads of the object) constrain movement of the object in the x-direction and the y-direction.

FIG. 4A illustrates a cross-sectional view of an object (e.g., carrier 460) on a fin 494A (e.g., of a support structure disposed in a loadlock chamber of a loadlock system), according to certain embodiments. FIG. 4B illustrates a cross-sectional view of a process kit ring 462 disposed on a carrier 460 on a fin 494A (e.g., of a support structure disposed in a loadlock chamber of a loadlock system), according to certain embodiments. FIG. 4C illustrates a top view of a process kit ring 462 disposed on a carrier 460 on a fin 494A (e.g., of a support structure disposed in a loadlock chamber of a loadlock system), according to certain embodiments. The carrier 460 may be disposed on one or more fins 494 (e.g., two fins, three fins, four fins, etc.).

The fin 494A may form a recess to secure the carrier 460. The recess may be shaped to align, locate and capture the stack of the process kit ring 462 on the carrier 460. The carrier 460 may have a pin contact to secure the process kit ring 462.

FIG. 4D illustrates a cross sectional view of an object (e.g., carrier 460) on a fin 494B (e.g., of a support structure disposed in a loadlock chamber of a loadlock system), according to certain embodiments. FIG. 4E illustrates a cross sectional view of a process kit ring 462 disposed on a carrier 460 on a fin 494B (e.g., of a support structure disposed in a loadlock chamber of a loadlock system), according to certain embodiments. FIG. 4F illustrates a top view of a process kit ring 462 disposed on a carrier 460 on fins 494A and/or 494B (e.g., of a support disposed in a loadlock chamber of a loadlock system), according to certain embodiments. The carrier 460 may be disposed on one or more fins 494A (e.g., one fin 494A, two fins 494A, three fins 494A, four fins 494A, etc.) and on one or more fins 494B (e.g., one fin 494B, two fins 494B, three fins 494B, four fins 494B, etc.).

The fin 494B may form a first recess to secure the carrier 460. The fin 494B may form a second recess to secure the process kit ring 462. Fin 494B may provide angular alignment (e.g., interfacing with the flat inner wall 722 of process kit ring) and may provide a retaining feature.

Figure 5A:
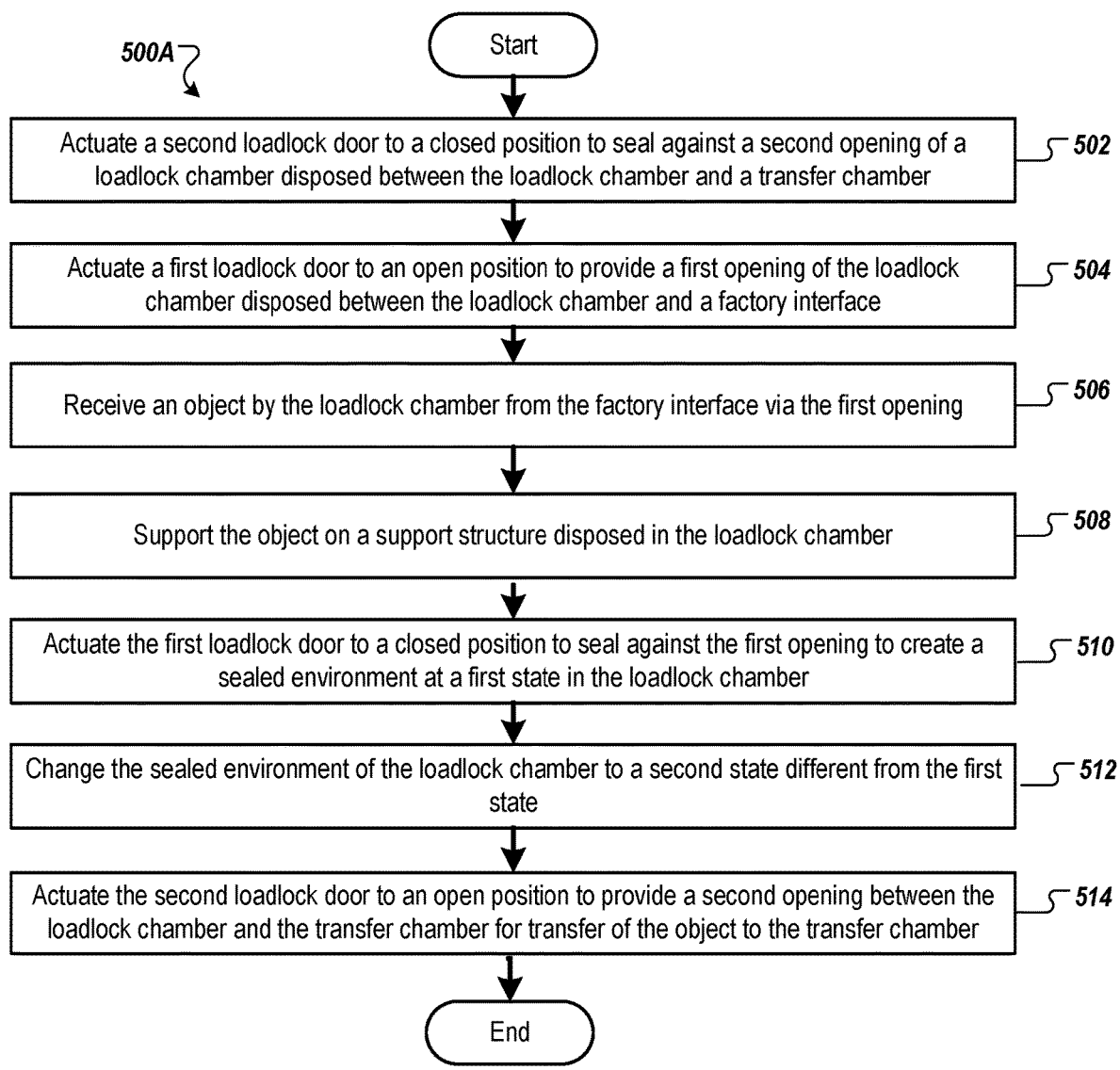
FIGS. 5A-C illustrate methods for process kit ring replacement in processing chambers via a loadlock system, according to certain embodiments.
Figure 5B:
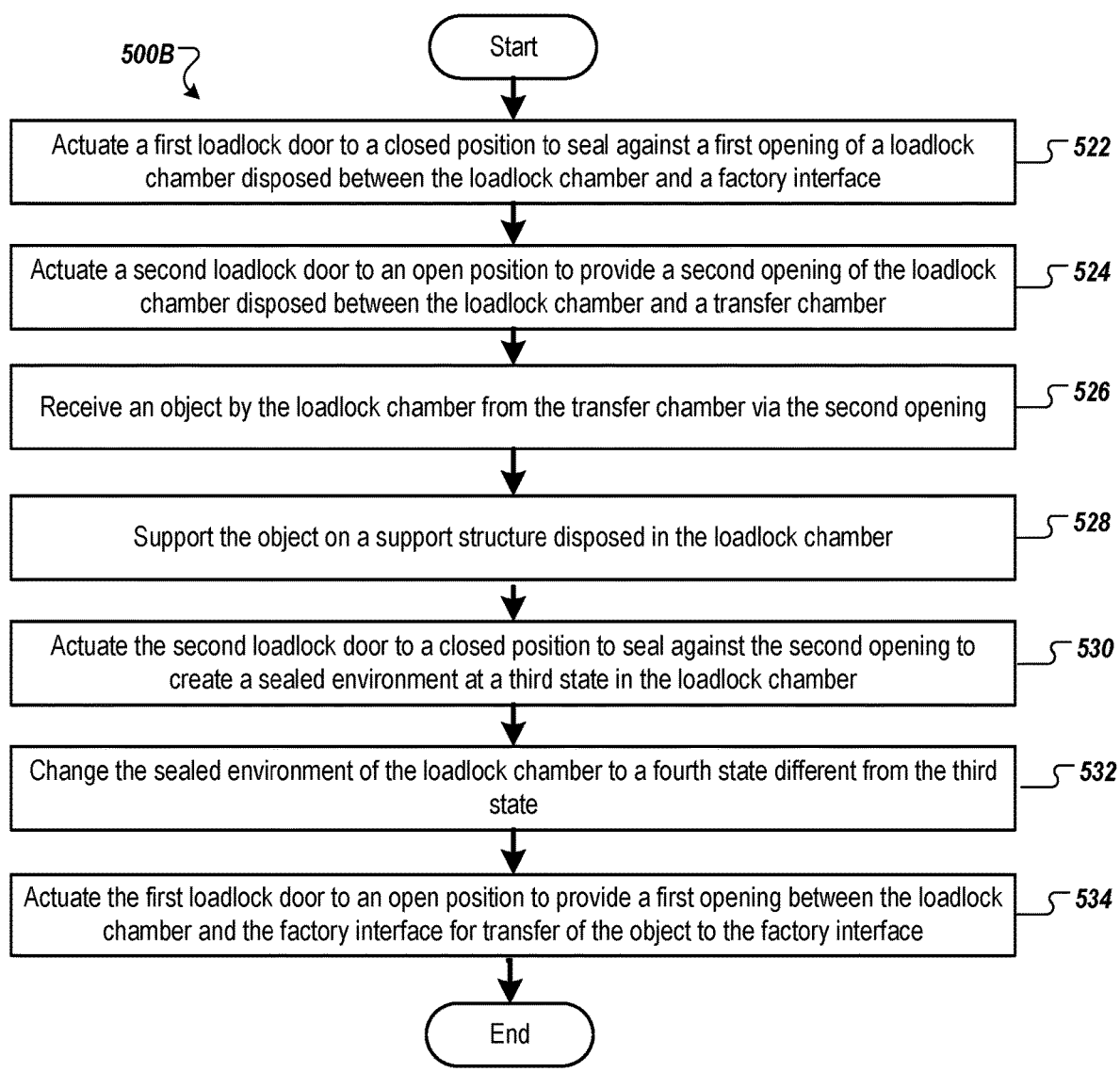
Figure 5C:
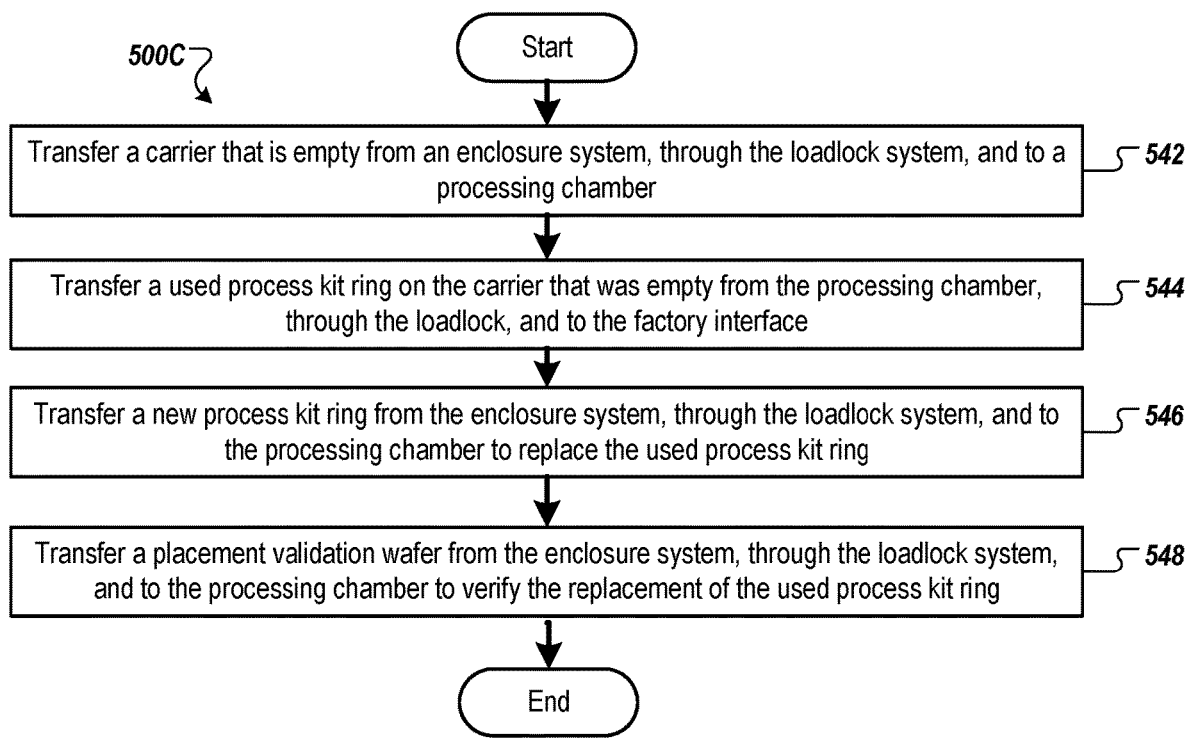

FIGS. 5A-C illustrate methods 500A-C for process kit ring replacement in processing chambers via a loadlock system, according to certain embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

Content may be disposed in an interior volume of an enclosure system. The content may be disposed on fins of support structures (e.g., comb structures) disposed in the interior volume of the process kit enclosure system. The content may include one or more of process kit ring carriers (e.g., empty or with a process kit ring disposed on the process kit ring carrier), process kit rings (e.g., disposed on the fins of the support structures, disposed on process kit ring carriers), or a placement validation wafer. The content may be manually loaded in the process kit enclosure system or the loading of the content into the process kit enclosure system may be automated (e.g., using robot arms).

Referring to FIG. 5A, at block 502 of method 500A, a second loadlock door of a loadlock system is actuated to a closed position to seal against a second opening of a loadlock chamber of the loadlock system that is disposed between the loadlock chamber and a transfer chamber of a wafer processing system.

At block 504, a first loadlock door of the loadlock system is actuated to an open position to provide a first opening of the loadlock chamber disposed between the loadlock chamber and a factory interface of the wafer processing system.

At block 506, an object is received by the loadlock chamber from the factory interface (e.g., from the enclosure system) via the first opening of the loadlock chamber. The object may be transferred into the loadlock chamber via a first robot arm of the factory interface. The factory interface may by at a first state (e.g., atmospheric pressure). The loadlock chamber may be configured to receive different types of objects, such as two or more of a wafer, a carrier, a process kit ring (e.g., on a carrier), or a placement validation wafer.

At block 508, the object is supported on a support structure (e.g., a set of fins and/or pins of the support structure) disposed in the loadlock chamber. The supporting of the first object on the support structure may provide a kinematic coupling between the support structure (e.g., each of the set of fins and/or pins) and a corresponding portion (e.g., feature) of a bottom surface of the object.

At block 510, the first loadlock door is actuated to a closed position to seal against the first opening to create a sealed environment at the first state (e.g., atmospheric pressure) in the first loadlock chamber.

At block 512, the sealed environment of the loadlock chamber is changed to a second state (e.g., vacuum, substantially similar to the state of the transfer chamber) that is different than the first state.

At block 514, a second loadlock door is actuated to provide a second opening between the loadlock chamber and a transfer chamber of the wafer processing system. The object is to be transferred from the loadlock chamber to the transfer chamber via a second robot arm of transfer chamber.

Referring to FIG. 5B, at block 522 of method 500B, a first loadlock door of a loadlock system is actuated to a closed position to seal against a first opening of a loadlock chamber of the loadlock system that is disposed between the loadlock chamber and a factory interface of a wafer processing system.

At block 524, a second loadlock door of the loadlock system is actuated to an open position to provide a second opening of the loadlock chamber disposed between the loadlock chamber and a transfer chamber of the wafer processing system.

At block 526, an object is received by the loadlock chamber from a transfer chamber via the second opening of the loadlock system. The object may be transferred into the loadlock chamber via a second robot arm of the transfer chamber. The transfer chamber may by at a third state (e.g., vacuum). The loadlock chamber may be configured to receive different types of objects, such as two or more of a wafer, a carrier, a process kit ring (e.g., on a carrier), or a placement validation wafer.

At block 528, the object is supported on a support structure (e.g., a set of fins and/or pins of the support structure) disposed in the loadlock chamber. The supporting of the first object on the support structure may provide a kinematic coupling between the support structure (e.g., each of the set of fins and/or pins) and a corresponding portion (e.g., feature) of a bottom surface of the object.

At block 530, the second loadlock door actuated to a closed position to seal against the second opening to create a sealed environment at the third state in the loadlock chamber.

At block 532, the sealed environment of the loadlock chamber is changed to a fourth state (e.g., atmospheric pressure) that is different than the third state. The loadlock chamber may be filled with an inert gas (e.g., nitrogen, helium, etc.) to raise the pressure to atmospheric pressure and to cool the object.

At block 534, a first loadlock door is actuated to provide a first opening between the loadlock chamber and a factory interface of the wafer processing system. The object is to be transferred from the loadlock chamber to the factory interface via a first robot arm of the factory interface.

Referring to FIG. 5C, at block 542 of method 500C, a carrier that is empty is transferred from an enclosure system, through the loadlock system, to a processing chamber (e.g., via method 500A of FIG. 5A). In some embodiments, an empty carrier may be picked up by an atmospheric robot, placed on an aligner and aligned, then placed in the loadlock chamber, dropped onto pins, and then the atmospheric robot retracts from the loadlock. A vacuum robot may pick up the empty carrier and move the empty carrier in front of a processing chamber that is to have a process kit change. The processing chamber may lift the used process kit ring, the vacuum robot blade may extend into the processing chamber, the process kit ring may be placed on the carrier, and the blade may retract. An LCF device may be used to accurately position the carrier during block 542.

At block 544, a used process kit ring is transferred on the carrier from the processing chamber, through the loadlock system, and to the enclosure system (e.g., via method 500B of FIG. 5B). The used process kit ring on the carrier may be loaded into the loadlock system, vented to atmosphere, and then picked up by the atmospheric robot, verified using aligner device for collection of position information. The used process kit ring on the carrier may be deposited in the lowest available set of fins (e.g., slot) in the enclosure system (e.g., FOUP).

At block 546, a new process kit ring (e.g., on a carrier) is transferred from the enclosure system, through the loadlock system, to the processing chamber to replace the used process kit ring (e.g., via method 500A of FIG. 5A). The atmospheric robot may pick up a new process kit ring (e.g., on a carrier) (e.g., from the lowest new process kit ring in the enclosure system), transports the new process kit ring (and carrier) to the aligner device to be aligned based on a unique feature. The new process kit ring is transferred to the processing chamber and positioned in the processing chamber as a replacement for the removed process kit ring. The transportation back and forth through the loadlock system may occur in a right, left, upper, lower, or any combination of loadlock openings.

At block 548, a placement validation wafer is transferred from the enclosure system, through the loadlock system, to the processing chamber to validate the replacement of the used process kit ring with the new process kit ring (e.g., via method 500A of FIG. 5A).

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   receiving, by a first loadlock chamber formed by a loadlock system of a wafer processing system, a process kit ring disposed on a carrier from a factory interface of the wafer processing system via a first opening of the loadlock system, wherein the process kit ring disposed on the carrier is transferred into the first loadlock chamber via a first robot arm of the factory interface, wherein the factory interface is at a first state, and wherein the first loadlock chamber is configured to receive different types of objects;
   sealing a first loadlock door against the first opening to create a first sealed environment at the first state in the first loadlock chamber;
   causing the first sealed environment of the first loadlock chamber to be changed to a second state that is different than the first state; and
   actuating a second loadlock door to provide a second opening between the first loadlock chamber and a transfer chamber of the wafer processing system, wherein the process kit ring disposed on the carrier is to be transferred from the first loadlock chamber to the transfer chamber via a second robot arm of the transfer chamber.

2. The method of claim 1, wherein the first loadlock chamber is configured to receive and support two or more of:
   a wafer;
   the process kit ring disposed on the carrier;
   the carrier without the process kit ring;
   or
   a placement validation wafer.

3. The method of claim 1 further comprising:
   responsive to the receiving of the process kit ring disposed on the carrier from the factory interface, supporting the process kit ring disposed on the carrier on a first set of fins of a support structure disposed in the first loadlock chamber.

4. The method of claim 3 further comprising:
   prior to the process kit ring disposed on the carrier being transferred from the first loadlock chamber to the transfer chamber, receiving a second object from the transfer chamber via the second robot arm; and
   supporting the second object on a second set of fins of the support structure.

5. The method of claim 3, wherein the supporting of the process kit ring disposed on the carrier on the first set of fins comprises providing a kinematic coupling between each of the first set of fins and a corresponding portion of a bottom surface of the carrier.

6. The method of claim 1 further comprising:
   responsive to the receiving of the process kit ring disposed on the carrier from the factory interface, supporting the process kit ring disposed on the carrier on a plurality of pins extending from a bottom chamber surface of the first loadlock chamber to provide a kinematic coupling between each of the plurality of pins and a corresponding portion of a bottom surface of the carrier.

7. The method of claim 1 further comprising:
   receiving, by the first loadlock chamber via the second opening, a used process kit ring on the carrier from the transfer chamber that is at a third state, wherein the used process kit ring on the carrier are transferred into the first loadlock chamber via the second robot arm;
   sealing the second loadlock door against the second opening to create, in the first loadlock chamber the first sealed environment at the third state;
   causing the first sealed environment of the first loadlock chamber to be changed to a fourth state that is different than the third state; and
   actuating the first loadlock door, wherein the used process kit ring on the first carrier are to be transferred from the first loadlock chamber to the factory interface via the first robot arm.

8. The method of claim 7,
   wherein the process kit ring is to be transferred to the transfer chamber via the second robot arm to replace the used process kit ring.

9. The method of claim 8 further comprising:
   receiving, by the first loadlock chamber via the first opening, a placement validation wafer, wherein the placement validation wafer is transferred into the first loadlock chamber via the first robot arm;
   sealing the first loadlock door against the first opening to create the first sealed environment at the first state in the first loadlock chamber;
   causing the first sealed environment of the first loadlock chamber to be changed to the second state; and
   actuating the second loadlock door, wherein the placement validation wafer is to be transferred to the transfer chamber via the second robot arm to validate placement of the process kit ring.

10. The method of claim 1 further comprising:
    receiving, by a second loadlock chamber formed by the loadlock system, a second object from the transfer chamber via a third opening of the loadlock system, wherein the second object is transferred into the second loadlock chamber via the second robot arm;
    sealing a third loadlock door against the third opening to create, in the second loadlock chamber, a second sealed environment at a third state;

causing the second sealed environment of the second loadlock chamber to be changed to a fourth state; and actuating a fourth loadlock door to provide a fourth opening between the second loadlock chamber and the factory interface, wherein the second object is to be transferred from the second loadlock chamber to the factory interface via the second robot arm.

11. A multi-object capable loadlock system comprising:

a first plurality of walls forming a first loadlock chamber of a wafer processing system, wherein the first loadlock chamber is configured to be disposed between a factory interface of the wafer processing system and a transfer chamber of the wafer processing system, wherein the factory interface is at a first state, and wherein the first loadlock chamber is configured to receive different types of objects;

one or more support structures disposed in the first loadlock chamber to support the different types of objects;

a first loadlock door coupled to a first opening of the first loadlock chamber, wherein the first loadlock door is to be actuated to a first open position to enable a first robot arm of the factory interface to transfer a process kit ring disposed on a carrier into the first loadlock chamber, wherein the first loadlock door is to seal against the first opening to create a first sealed environment in the first loadlock chamber;

one or more ports coupled to the first plurality of walls to enable the first sealed environment of the first loadlock chamber to be changed from the first state to a second state that is different from the first state; and a second loadlock door coupled to a second opening of the first loadlock chamber, wherein the second loadlock door is to be actuated to a second open position to enable a second robot arm of the transfer chamber to transfer the process kit ring disposed on the carrier from the first loadlock chamber to the transfer chamber.

12. The multi-object capable loadlock system of claim 11, wherein the first loadlock chamber is configured to receive and support two or more of:

a wafer;

the process kit ring disposed on the carrier;

the carrier without the process kit ring; or a placement validation wafer.

13. The multi-object capable loadlock system of claim 11, wherein the one or more support structures comprise:

a first set of fins configured to provide a first kinematic coupling between each of the first set of fins and a corresponding portion of a first bottom surface of the carrier; and a second set of fins configured to provide a second kinematic coupling between each of the second set of fins and the corresponding portion of a second bottom surface of a second object.

14. The multi-object capable loadlock system of claim 11, wherein the one or more support structures comprise:

a plurality of pins extending from a bottom chamber surface of the first loadlock chamber to provide a kinematic coupling between each of the plurality of pins and a corresponding portion of a bottom surface of the carrier.

15. The multi-object capable loadlock system of claim 11 further comprising:

a second plurality of walls forming a second loadlock chamber disposed above the first loadlock chamber, wherein the second loadlock chamber is configured to be disposed between the factory interface and the transfer chamber;

a third loadlock door coupled to a third opening of the second loadlock chamber, wherein the third loadlock door is to be actuated to a third open position to enable the first robot arm to transfer a second object into the second loadlock chamber, wherein the third loadlock door is to seal against the third opening to create a second sealed environment in the second loadlock chamber; and a fourth loadlock door coupled to a fourth opening of the second loadlock chamber, wherein the fourth loadlock door is to be actuated to a fourth open position to enable the second robot arm to transfer the second object from the second loadlock chamber to the transfer chamber.

16. The multi-object capable loadlock system of claim 11, wherein the first loadlock chamber is configured to:

receive the carrier from the factory interface, wherein the carrier is to be transferred to the transfer chamber via the first loadlock chamber;

receive a used process kit ring disposed on the carrier from the transfer chamber, wherein the used process kit ring on the carrier is to be transferred to the factory interface via the first loadlock chamber, wherein the process kit ring is to be transferred to the transfer chamber via the first loadlock chamber to replace the used process kit ring; and receive a placement validation wafer from the factory interface, wherein the placement validation wafer to be transferred to the transfer chamber via the first loadlock chamber to verify placement of the process kit ring.

17. The multi-object capable loadlock system of claim 11 further comprising:

a temperature controlling device coupled to the first loadlock chamber to control temperature of the first loadlock chamber.

18. A process kit capable loadlock system comprising:

a first plurality of walls forming a first loadlock chamber, wherein the first loadlock chamber is configured to be disposed between a factory interface of a wafer processing system and a transfer chamber of the wafer processing system, wherein the factory interface forms a first sealed environment at a first state and the transfer chamber forms a second sealed environment at a second state;

a first loadlock door coupled to a first opening of the first loadlock chamber, wherein the first loadlock door is to be actuated to a first open position to enable a first robot arm of the factory interface to transfer a first process kit ring disposed on a carrier into the first loadlock chamber, wherein the first loadlock door is to seal against the first opening to create a third sealed environment in the first loadlock chamber at the first state;

one or more ports coupled to the first plurality of walls to enable causing the third sealed environment of the first loadlock chamber to be changed from the first state to a third state that is different from the first state; and a second loadlock door coupled to a second opening of the first loadlock chamber, wherein the second loadlock door is to be actuated to a second open position to enable a second robot arm of the transfer chamber to transfer the first process kit ring disposed on the carrier from the first loadlock chamber to the transfer chamber to replace a used process kit ring.

19. The process kit capable loadlock system of claim 18, wherein the first state is at atmospheric pressure, wherein the second state and the third state are below the atmospheric pressure.

20. The process kit capable loadlock system of claim 18 further comprising:
  one or more support structures disposed in the first loadlock chamber to support the first process kit ring disposed on the carrier, wherein the one or more support structures are to provide a kinematic coupling with a bottom surface of the carrier.

* * * * *